(12) United States Patent
Yamanaka et al.

(10) Patent No.: US 8,350,161 B2
(45) Date of Patent: Jan. 8, 2013

(54) CIRCUIT BOARD AND STRUCTURE USING THE SAME

(75) Inventors: Kimihiro Yamanaka, Yasu (JP);
Manabu Ichinose, Yasu (JP); Satoshi Nakamura, Yasu (JP)

(73) Assignee: Kycera Corporation, Kyoto (JP)

( * ) Notice: Subject to any disclaimer, the term of this patent is extended or adjusted under 35 U.S.C. 154(b) by 148 days.

(21) Appl. No.: 12/696,962

(22) Filed: Jan. 29, 2010

(65) Prior Publication Data
US 2010/0193231 A1  Aug. 5, 2010

(30) Foreign Application Priority Data

Jan. 30, 2009 (JP) ................................ 2009-020175
Feb. 25, 2009 (JP) ................................ 2009-042842

(51) Int. Cl.
| H01R 12/04 | (2006.01) |
| H05K 1/11 | (2006.01) |
| H05K 1/03 | (2006.01) |
| H05K 1/09 | (2006.01) |
| H05K 1/16 | (2006.01) |
| H05K 7/00 | (2006.01) |
| H05K 7/10 | (2006.01) |
| H05K 7/12 | (2006.01) |
| H05K 7/02 | (2006.01) |
| H05K 7/04 | (2006.01) |

(52) U.S. Cl. ........ 174/261; 174/255; 174/256; 174/257; 174/260; 174/262; 361/760; 361/767; 361/792; 361/793; 361/794; 361/807; 361/808; 361/810; 361/795

(58) Field of Classification Search ........................ None
See application file for complete search history.

(56) References Cited

U.S. PATENT DOCUMENTS

| 5,382,831 A * | 1/1995 | Atakov et al. ................. 257/767 |
| 6,433,287 B1 | 8/2002 | Sasaki et al. |
| 6,483,045 B1 * | 11/2002 | Wang et al. ................... 174/264 |
| 6,818,996 B2 * | 11/2004 | Mertol et al. ................. 257/773 |

FOREIGN PATENT DOCUMENTS

| JP | 8-116174 | 5/1996 |
| JP | 2001035851 A | 2/2001 |

* cited by examiner

*Primary Examiner* — Jayprakash N Gandhi
*Assistant Examiner* — Dion Ferguson
(74) *Attorney, Agent, or Firm* — DLA Piper (US) LLP

(57) ABSTRACT

According to one of the invention, a circuit board comprises a conductive layer. The conductive layer includes a first land portion, a second land portion apart from the first land portion in a plan view, and a line portion connecting the first land portion and the second land portion to each other. The line portion includes lead portions through which a current is to flow and an opening portion arranged between the lead portions. The opening portion penetrates the conductive layer in a thickness direction.

14 Claims, 11 Drawing Sheets

US 8,350,161 B2

CIRCUIT BOARD AND STRUCTURE USING THE SAME

CROSS REFERENCE TO RELATED APPLICATION(S)

The present application claims priority under 35 U.S.C. §119 to Japanese Patent Application No. 2009-020175, filed on Jan. 30, 2009, entitled "CIRCUIT BOARD AND MOUNTING STRUCTURE USING THE SAME", the entirety of which is incorporated by reference herein.

The present application claims priority under 35 U.S.C. §119 to Japanese Patent Application No. 2009-042842, filed on Feb. 25, 2009, entitled "CIRCUIT BOARD AND MOUNTING STRUCTURE USING THE SAME", the entirety of which is incorporated by reference herein.

SUMMARY OF THE INVENTION

According to one of the invention, a circuit board comprises a conductive layer. The conductive layer includes a first land portion, a second land portion apart from the first land portion in a plan view, and a line portion connecting the first land portion and the second land portion to each other. The line portion includes lead portions through which a current is to flow and an opening portion arranged between the lead portions. The opening portion penetrates the conductive layer in a thickness direction.

BACKGROUND OF THE INVENTION

1. Field of the Invention

The present invention relates to a circuit board and a structure used for electronic devices (e.g., audiovisual devices, electrical appliances, communication devices, computer devices, and the peripheral devices thereof).

2. Description of the Related Art

A structure obtained by mounting or embedding an electronic component on or in a circuit board has been used in electronic devices.

As shown in FIG. 16, a circuit board 9 includes a plurality of conductive layers 91 apart from each other in the thickness direction, insulating layers 90 interposed therebetween, and a plurality of via conductors 92 electrically connecting the conductive layers 91. The via conductors 92 are formed in the insulating layers 90 to be apart from each other in a plan view. In the circuit board 9, the conductive layers 91 and the via conductors 92 constitute a power supply line and a signal line (refer to Japanese Unexamined Patent Application Publication No. 8-116174).

Focusing on a single conductive layer 91 (other than a conductive layer 91' that is located in an outer layer), each of the via conductors 92 is connected to an upper surface 93 and a lower surface 94 of the conductive layer 91. For example, a current flows in the order of the via conductor 92 (thickness direction), the conductive layer 91 (plane direction), and the via conductor 92 (thickness direction) as indicated by an arrow in the drawing. Since a current flows through a path having the shortest distance in a conductive region, the current is concentrated in a portion 95 (a portion circled in the drawing) in the connecting region between the via conductor 92 and the conductive layer 91, which causes unbalanced current density. Therefore, in the certain portion 95, metal atoms contained in the via conductor 92 may migrate due to a collision between electrons and metal atoms. This phenomenon is called electromigration. Electromigration decreases the metal density in the certain portion 95 (portion in which a current is concentrated) of the connecting region between the via conductor 92 and the conductive layer 91. Consequently, cracking is caused in the connecting region between the via conductor 92 and the conductive layer 91, which sometimes decreases the reliability of the circuit board 9.

Electromigration mainly occurs in a power supply line, but it is highly likely to occur in a signal line too if the size of a signal line becomes smaller in the future.

Focusing on a conductive layer 91' that is located in an outer layer, a single via conductor 92' is connected to the conductive layer 91'. Even in this case, electromigration occurs in a certain portion 95' of the connecting region between the conductive layer 91 and the via conductor 92' connected to the conductive layer 91', which sometimes decreases the connection reliability of an electronic component 96 to the circuit board 9.

DESCRIPTION OF THE PREFERRED EMBODIMENTS

First Embodiment

A circuit board and a structure according to a first embodiment of the present invention is described in detail with reference to the attached drawings.

Figure 1:
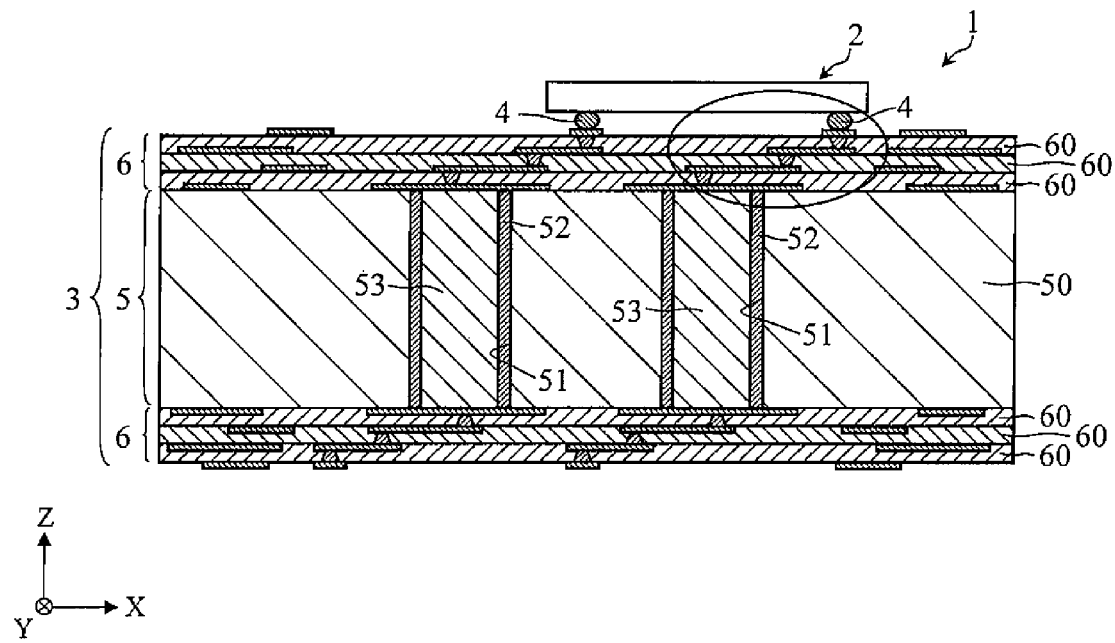
FIG. 1 is a sectional view of a structure according to a first embodiment of the present invention.

A structure 1 shown in FIG. 1 is used for electronic devices such as audiovisual devices, electrical appliances, communication devices, computer devices, and the peripheral devices thereof. The structure 1 includes an electronic component 2 and a circuit board 3.

The electronic component 2 is a semiconductor device such as an integrated circuit (IC) or a large-scale integrated circuit (LSI), and is mounted on the circuit board 3 through conductive bumps 4 such as solder using a flip chip packaging technology. The electronic component 2 has a base material composed of a semiconductor material such as silicon, germanium, gallium arsenide, gallium arsenide phosphide, gallium nitride, or silicon carbide. The electronic component 2, for example, having a thickness of 0.1 mm or more and 1 mm or less may be used.

The circuit board 3 includes a core substrate 5 and a pair of circuit layers 6 on an upper surface and a lower surface of the core substrate 5.

The core substrate 5 electrically connects the pair of circuit layers 6 to each other while maintains the strength of the circuit board 3. The thickness of the core substrate 5 is 0.3 mm or more and 1.5 mm or less. The core substrate 5 includes insulating bases 50, through-holes 51 formed in the insulating bases 50 to penetrate the insulating bases 50, through-hole conductors 52 formed in the through-holes 51, and insulating bodies 53 formed in the through-hole conductors 52.

Each of the insulating bases 50 is a principal part of the core substrate 5. The insulating base 50 can be manufactured, for example, by stacking a plurality of sheets obtained by impregnating a reinforced material with a thermosetting resin and then by curing the thermosetting resin through thermal pressing or the like.

A material composed of, for example, plain-woven glass fiber or resin fiber may be used as the reinforced material. The resin fiber can be formed of a polyparaphenylene benzobisoxazole resin or a wholly aromatic polyamide resin.

Examples of the thermosetting resin include epoxy resins, bismaleimide triazine resins, and cyanate resins.

The insulating base 50 can also be manufactured from a low thermal expansion resin without using the reinforced material. In this case, the insulating base 50 may be manufactured from only a low thermal expansion resin or may be manufactured by stacking a plurality of sheets composed of a low thermal expansion resin through adhesive resins.

Examples of the low thermal expansion resin for the insulating base 50 include polyparaphenylene benzobisoxazole resins, wholly aromatic polyamide resins, wholly aromatic polyester resins, polyimide resins, liquid crystal polymer resins and/or a combination thereof. Among them, a polyparaphenylene benzobisoxazole resin is preferably used. The coefficient of thermal expansion of the polyparaphenylene benzobisoxazole resin is as low as −5 ppm/° C. or more and 5 ppm/° C. or less. With such a low thermal expansion resin, the thermal expansion of the core substrate 5 itself can be suppressed. The coefficient of thermal expansion is in conformity with ISO 11359-2:1999.

Each of the through-holes 51 is a portion where each of the through-hole conductors 52 is formed and penetrates the core substrate 5 in the thickness direction (Z axis direction). The through-hole 51 has a cylindrical shape having a diameter of, for example, 0.1 mm or more and 1 mm or less. Such a through-hole 51 can be formed by publicly known drilling.

The through-hole conductor 52 electrically connects the pair of circuit layers 6 to each other, and is formed along an inner surface of the through-hole 51. The through-hole conductor 52 is composed of a conductive material such as copper, silver, gold, aluminum, nickel, chromium and/or a combination thereof. The through-hole conductor 52 can be formed by performing electrolytic plating or the like on the inner surface of the through-hole 51.

Each of the insulating bodies 53 fills the remaining space surrounded by the through-hole conductors 52. The insulating body 53 can be formed by filling the remaining space with a resin material and then by curing the resin material. Examples of the resin material for the insulating body 53 include polyimide resins, acrylic resins, epoxy resins, cyanate resins, fluorocarbon resins, silicon resins, polyphenylene ether resins, bismaleimide triazine resins and/or a combination thereof. By forming the insulating body 53 in the core substrate 5, the via conductors 8 described later can be formed immediately on and under the insulating body 53. Therefore, the length of a conductive line routed from the through-hole conductor 52 can be shortened, which can achieve the miniaturization of the circuit board 3.

The pair of circuit layers 6 are stacked on both surfaces of the core substrate 5 and include a plurality of insulating layers 60, a plurality of conductive layers 7 on the insulating layers 60, and a plurality of via conductors 8 penetrating the insulating layer 60 and electrically connecting the conductive layers 7 to each other. The conductive layers 7 and the via conductors 8 are electrically connected to each other to constitute a circuit member. The circuit member includes a power supply line and a signal line.

Each of the insulating layers 60 is configured to ensure the insulation of a portion other than the circuit member and has a through-hole 61. The through-hole 61 is a portion where each of the via conductors 8 is formed. The through-hole 61 can be formed by perpendicularly irradiating the insulating layer 60 with laser beams using, for example, an yttrium-aluminum-garnet (YAG) laser device, a $CO_2$ laser device, or an excimer laser device. The output energy of the laser beams is set to be, for example, $1.0\times10^{-3}$ J or higher and $5.0\times10^{-1}$ J or lower. The irradiation time of the laser beams is set to, for example, $1.0\times10^{-3}$ sec or longer and 1.0 sec or shorter. By such a method, the laser beams are perpendicularly applied from the upper surface of the insulating layer 60 and the through-hole 61 whose lower portion is narrower in width than the upper portion can be formed.

After the through-hole 61 is formed, desmearing may be performed to remove the residues that adhere to the inner surface of the through-hole 61. The desmearing can be performed by plasma treatment or etching treatment. The plasma treatment can be performed, for example, by processing the inner surface using a microwave in an argon gas or oxygen gas atmosphere. The etching treatment can be performed by wet etching with an etching solution. A permanganic acid aqueous solution obtained by, for example, adding 20 g or more and 40 g or less of permanganic acid and 35 g or more and 45 g or less of sodium hydroxide to a liter of distilled water can be used as the etching solution. The etching solution is preferably used after warming, that is, at 30° C. or more and 40° C. or less. In that case, the etching time is set to, for example, 2 minutes or longer and 4 minutes or shorter.

The insulating layer 60 is preferably formed of a material whose coefficient of thermal expansion is close to that of the electronic component 2. The thickness of the insulating layer 60 after drying is, for example, 1 μm or more and 15 μm or less. The insulating layer 60 is formed of, for example, a thermosetting resin or a thermoplastic resin. The coefficient of thermal expansion of the insulating layer 60 is set to, for example, 15 ppm/° C. or more and 80 ppm/° C. or less.

Examples of the thermosetting resin for the insulating layer 60 include polyimide resins, acrylic resins, epoxy resins, urethane resins, cyanate resins, silicon resins, bismaleimide triazine resins, and/or a combination thereof.

The thermoplastic resin for the insulating layer 60 needs to have thermal resistance so as to endure heat treatment during reflow soldering, in addition to a coefficient of thermal expansion close to that of the electronic component 2. Therefore, the thermoplastic resin for the insulating layer 60 preferably has a softening temperature of 200° C. or higher. Examples of the thermoplastic resin include polyether ketone resins, polyethylene terephthalate resins, polyphenylene ether resins, and/or a combination thereof.

The insulating layer 60 may include a filler having a plurality of particles. Since the viscosity of the insulating layer 60 before curing can be adjusted by providing a filler in the insulating layer 60, the dimensional accuracy of the thickness of the insulating layer 60 can be improved. The particles having a spherical shape whose diameter is, for example, 0.05 µm or more and 6 µm or less can be used as the filler. The particles of the filler is composed of a material having a coefficient of thermal expansion of −5 ppm/° C. or more and 5 ppm/° C. or less. Examples of the material include silicon oxide (silica), silicon carbide, aluminum oxide, aluminum nitride, aluminum hydroxide and/or a combination thereof.

Figure 2:
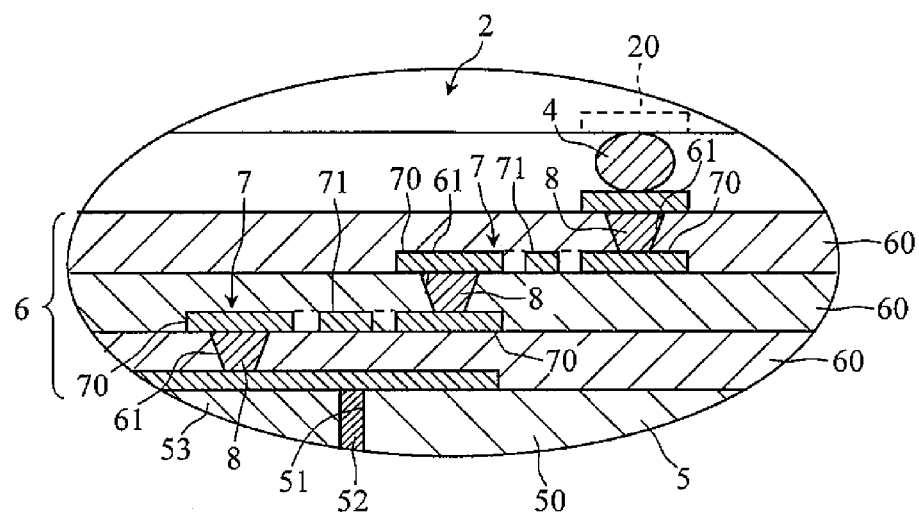
FIG. 2 is an enlarged sectional view of a principal part (a region circled in a solid line) of the structure shown in FIG. 1.

The plurality of conductive layers 7 constitute the circuit member together with the via conductors 8. As shown in FIGS. 1 and 2, the plurality of conductive layers 7 are apart form each other in the thickness direction. Each of the conductive layers 7 is composed of a metallic material such as copper, silver, gold, aluminum, nickel, chromium, and/or a combination thereof, and includes land portions 70 and a line portion 71.

Figure 3:
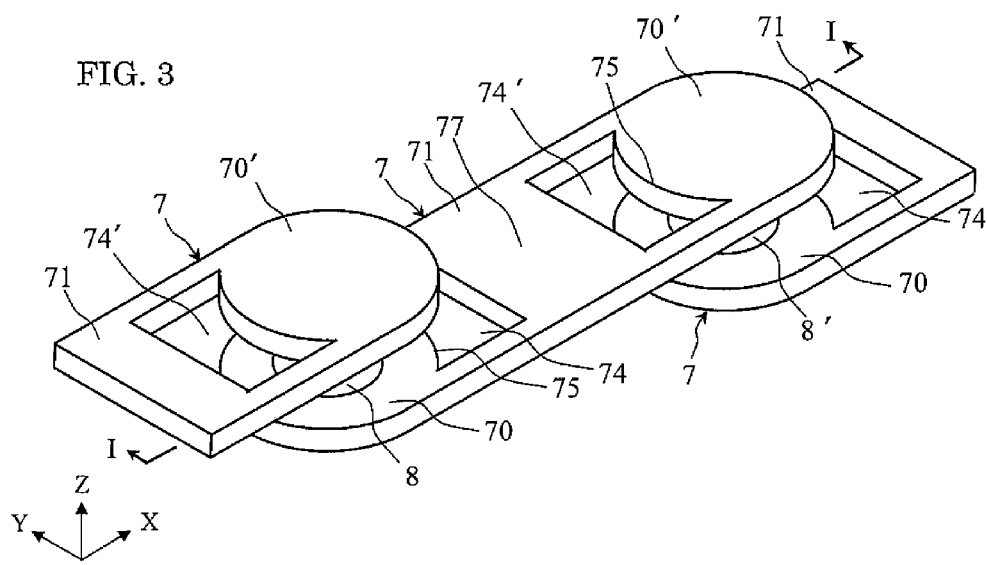
FIG. 3 is a fragmentary perspective view showing a conductive layer of the structure shown in FIG. 1 and the surrounding area thereof.
Figure 5:
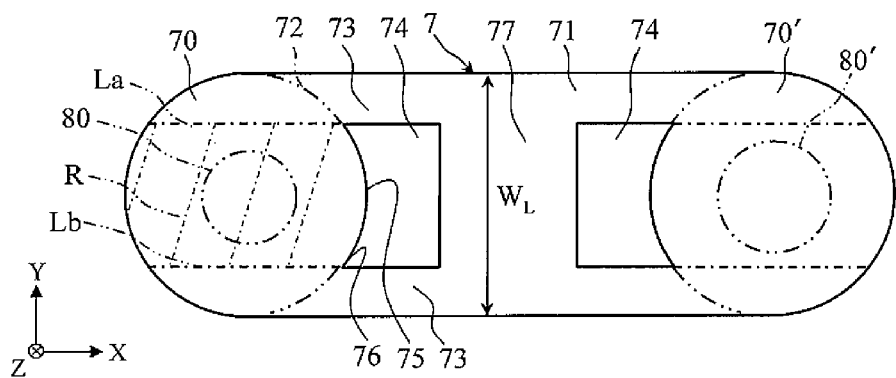
FIG. 5 is a plan view of the conductive layer shown in FIG. 3.

As shown in FIG. 3, the land portions 70 and 70' are arranged apart from each other in a plan view and each of the land portions 70 is a portion where a via conductor 8 is connected to one principal surface of the land portion 70. As shown in FIG. 5, the planar shape of the land portion 70 is similar to a connecting area 80 with the via conductor 8 and is larger than that of the connecting area 80. Therefore, the alignment precision between the land portion 70 and the via conductor 8 can be increased and the connection reliability in the connecting region between the conductive layer 7 and the via conductor 8 can be improved. The area of the planar shape of the land portion 70 is preferably 1.8 times or more and 2.5 times or less that of the connecting area 80.

Figure 4:
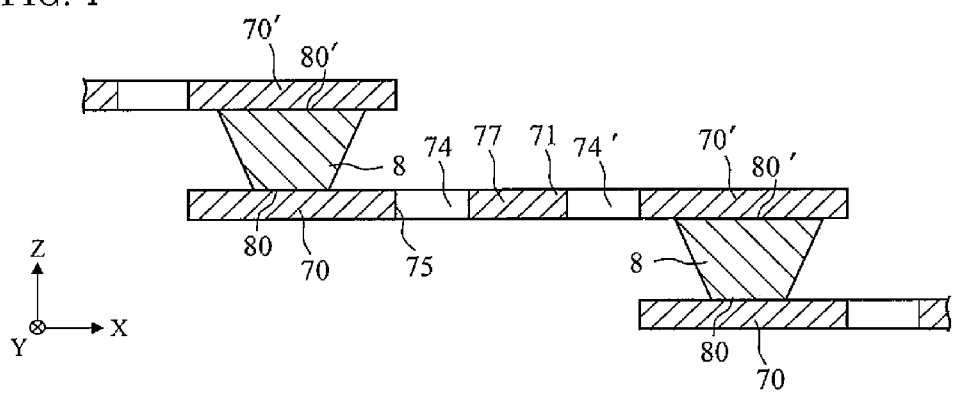
FIG. 4 is a sectional view taken along line IV-IV of the conductive layer shown in FIG. 3.

As shown in FIGS. 3 to 5, the line portion 71 connects the two land portions 70 to each other. The width of the line portion 71 is equal to the width of the land portions 70. The area where the land portions 70 are connected to the line portion 71 is called a boundary portion 72.

Such a conductive layer 7 is formed into a desired shape by forming a conductive film using a well-known film formation method and then by patterning the conductive film. Examples of the film formation method include vapor deposition, chemical vapor deposition (CVD), sputtering, and/or a combination thereof. The patterning can be performed by, for example, photolithography.

As shown in FIGS. 1 and 2, the via conductor 8 connects the conductive layers 7 to each other, the conductive layers 7 being apart from each other in the thickness direction, and is composed of a conductive material having a columnar shape such as copper, silver, gold, aluminum, nickel, chromium, and/or a combination thereof. The via conductor 8 has a tapered shape in which the lower portion is narrower than the upper portion and is connected to one principal surface of the land portion 70 of the conductive layer 7 as described above.

As shown in FIG. 2, the via conductor 8 formed in the uppermost layer of the insulating layers 60 functions as an external connection terminal and is a portion connected to the electronic component 2 through a pad 20 and a bump 4.

The via conductor 8 can be formed by providing a plating film on the surface of the through-hole 61 using electroless plating or the like.

According to the structure 1 of this embodiment, the line portion 71 includes a pair of lead portions 73 and 73' and an opening portion 74. The lead portions 73 and 73' are apart from each other in the width direction of the line portion 71. A current flows through the lead portions 73 and 73'. The opening portion 74 between the lead portions 73 and 73' penetrates the line portion 71 in the thickness direction (Z axis direction) of the conductive layer 7. The opening portion 74 is filled with a part of the insulating layer 60. Therefore, since the opening portion 74 divides a current flowing through the line portion 71 into the lead portions 73 and 73', the current flows into the connecting area 80 between the land portion 70 and the via conductor 8 without being concentrated in one part. Thus, a current in the connecting area 80 is dispersed, which can suppress the generation of electromigration. Consequently, the cause of cracking in the connecting area 80 can be suppressed, which can improve the connection reliability in the connecting region between the conductive layer 7 and the via conductor 8 in the circuit board 3.

As shown in FIG. 5, the length in the longitudinal direction (X axis direction) of the line portion 71 is set to 1 µm or more and the width in the width direction (Y axis direction) of the line portion 71 is set to 0.8 times or more and 1.5 times or less that of the via conductor 8. The length in the longitudinal direction (X axis direction) of the line portion 71 is preferably set to 5 µm or more in consideration of ease of filling of the opening portion 74 with the insulating layer 60.

The opening portion 74 has a counter side 75 that faces the connecting area 80 between the land portion 70 and the via conductor 8. The current divided by the opening portion 74 flows from the lead portions 73 and 73' into the connecting area 80.

The both end portions of the counter side 75 each has a protruding portion 76 that protrudes toward the connecting area 80. In this structure, both end portions of the counter side 75 are brought closer to the connecting area 80 in the longitudinal direction of the line portion 71 than a middle portion of the counter side 75. Therefore, the divided current flowing through the lead portion 73 (73') is less likely to be merged in the land portion 70 due to the protruding portion 76, and the current from the land portion 70 (70') is easy to be divided by the protruding portion 76.

The angles between the counter side 75 and the lead portions 73 and 73' is less than 90 degrees.

The connecting area 80 is located within an overlapping region R where the land portion 70 overlaps with a locus area that is hypothetically made by moving the opening portion 74 toward the land portion 70 in the longitudinal direction of the line portion 71. The overlapping region R is a shaded region shown in FIG. 5. The overlapping region R is a region of the land portion 70 surrounded by hypothetical lines La and Lb which are extension lines of boundary lines between lead portions 73 (73') and the opening portion 74. The both end portions of the counter side 75 are apart from the connecting area 80 in the width direction of the line portion 71. Therefore, a current flows into the connecting area 80 from the end portions of the counter side 75 while the current remains sufficiently divided.

The line portion 71 includes the opening portion 74 close to the land portion 70, an opening portion 74' apart from the opening portion 74 and close to a land portion 70', and a connecting portion 77 formed between the opening portions 74 and 74' in the width direction (Y axis direction) of the conductive layer 7. A current flowing in the connection portion 77 is divided by the opening portion 74 (74'), and the divided current flows into the connecting area 80 (80') through the lead portions 73 and 73'. As a result, the current is widely distributed around the connecting area 80 (80'), which can suppress the generation of electromigration. Furthermore, since the line portion 71 has the connecting portion 77 between the opening portions 74, the strength of the line portion 71 is increased.

The present invention is not limited to the above-described embodiment, and various changes and modifications can be made without departing from the spirit and scope of the present invention. For example, the planar shape of the via conductor is not necessarily a circle, and may be an ellipse or a polygon. The line portion is not necessarily straight, and may be partially curved in a region where the opening portions are not formed. The width ($W_L$) of the line portion is not necessarily equal to those of the land portions, and may be smaller than those of the land portions. The number of the opening portions formed in the line portion is not necessarily two, and may be one or three or more. The planar shape of the opening portions is not necessarily a circle, and the conductive layer may have one of the structures shown in FIGS. 6A to 6C. The width ($W_L$) of the line portion is not necessarily constant, and the line portion may have a structure shown in FIG. 6D.

In the conductive layers 7A, 7B, 7C, and 7D respectively shown in FIGS. 6A to 6D, the shapes of opening portions 74A, 74B, 74C, and 74D are different from that of the conductive layer 7 (refer to FIGS. 1 to 5) in the circuit board 3 described above.

Figure 6A:
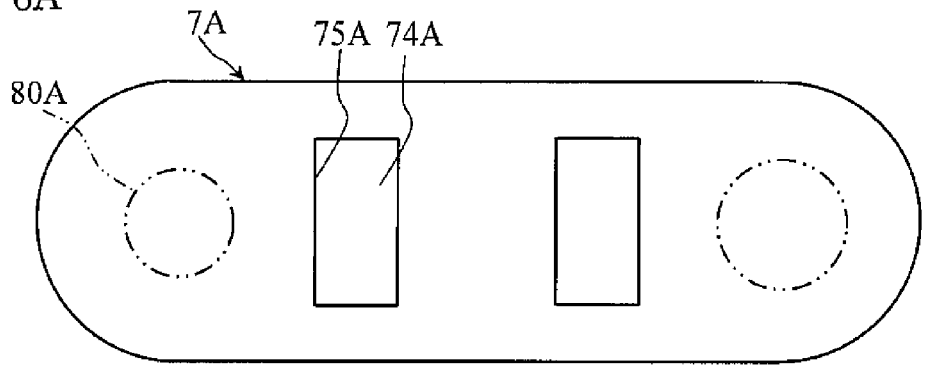
FIGS. 6A to 6D are plan views showing other examples of the conductive layer according to the first embodiment of the present invention.

In the planar shape of the opening portion 74A shown in FIG. 6A, a counter side 75A is straight in the width direction of the line portion 71A.

Figure 6B:
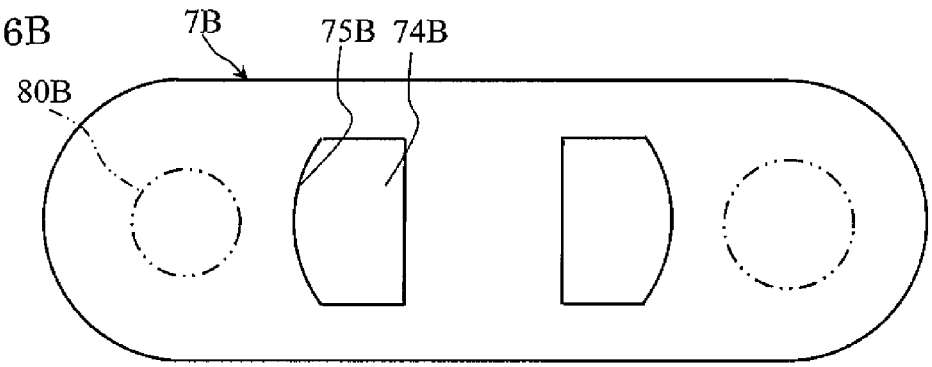

In the planar shape of the opening portion 743 shown in FIG. 6B, a counter side 753 is curved such that the center of the counter side 75B protrudes toward the connecting area 80B.

Figure 6C:
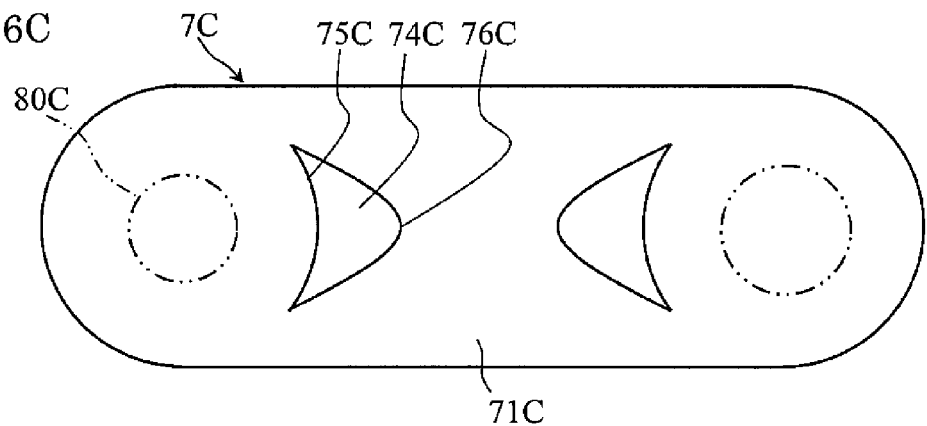

In the planar shape of the opening portion 74C shown in FIG. 6C, the opening portion 74C becomes narrower toward a center of the line portion 71C. In this structure, wider lead portions can be formed in the line portion 71C while a current remains sufficiently divided. This can suppress cracking in the line portion 71C caused by thermal stress.

The planar shape of the opening portion 74C is a triangular shape having a counter side 75C. In the triangular shape, preferably, a corner 76C facing the counter side 75C is round and the radius of curvature of the corner 76C is set to 2 µm or more and 10 µm or less. Thus, thermal stress at the corner 76C can be dispersed.

Figure 6D:
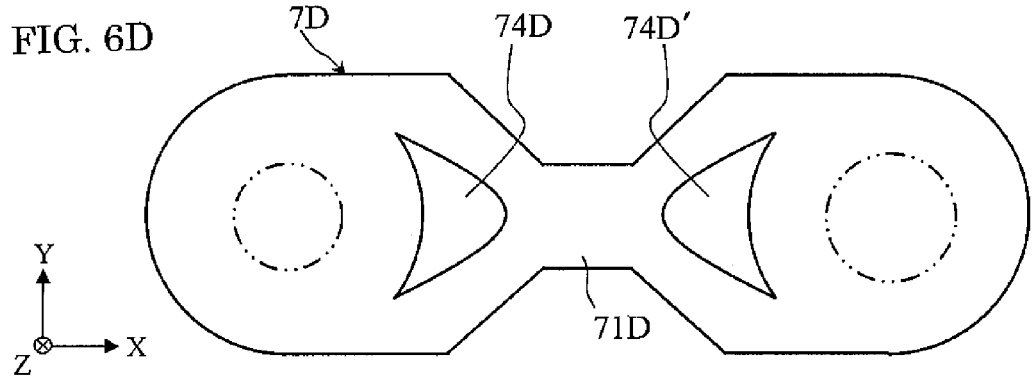

In the planar shape of the line portion 71D shown in FIG. 6D, the line portion 71D has a minimum width between the opening portions 74D and 74D'. The minimum width of the line portion 71D is smaller than a maximum width of the opening portions 74D and 74D'. In a case that a connection portion between the opening portion 74D and 74'D is extended, highly dense circuit pattern can be provided. The minimum width of the line portion 71D is preferably set to 0.5 times or more the maximum width of line portion 71D and less than or equal to the maximum width of the line portion 71D.

As the opening portion 74D becomes, narrower, the line portion 71 also becomes narrower.

The structure of the line portion 71D with varied widths shown in FIG. 6D may be applied to the conductive layers 7 shown in FIGS. 5, 6A, and GB.

Second Embodiment

A circuit board and a structure according to a second embodiment of the present invention are described in detail with reference to the attached drawings. The same elements as in the first embodiment are not described.

Figure 7:
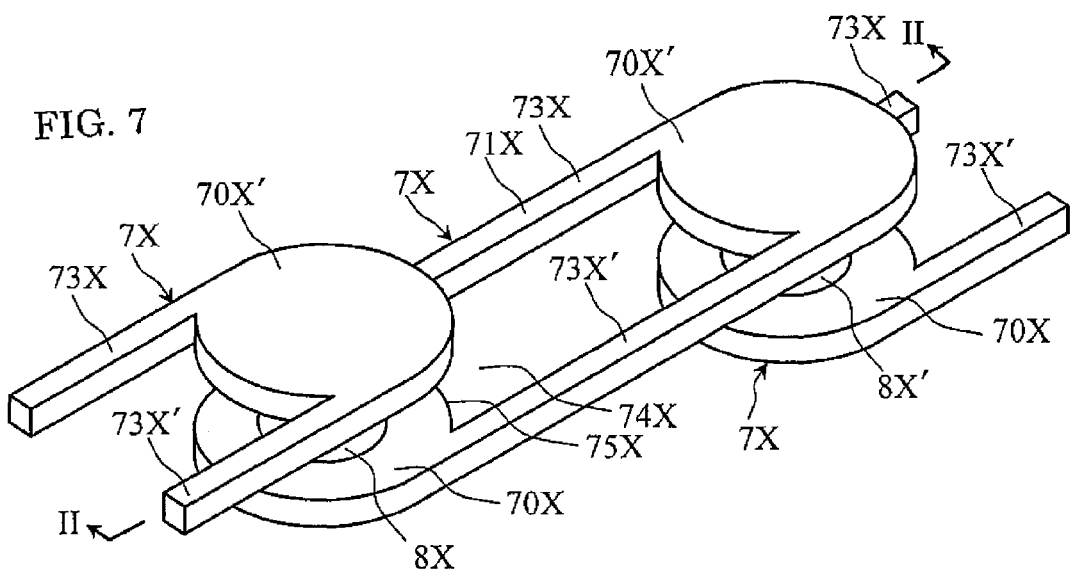
FIG. 7 is a fragmentary perspective view showing a conductive layer of a structure according to a second embodiment of the present invention and the surrounding area thereof.
Figure 8:
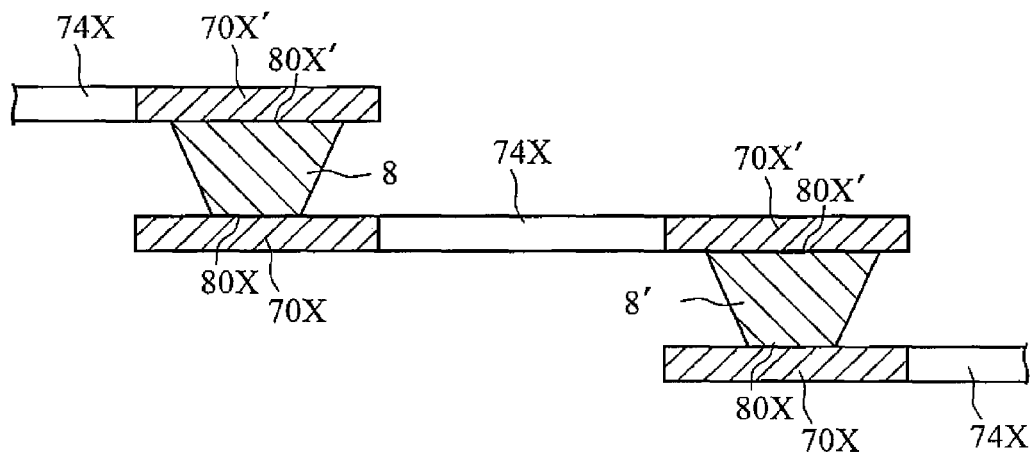
FIG. 8 is a sectional view taken along line VIII-VIII of the conductive layer shown in FIG. 7.
Figure 9:
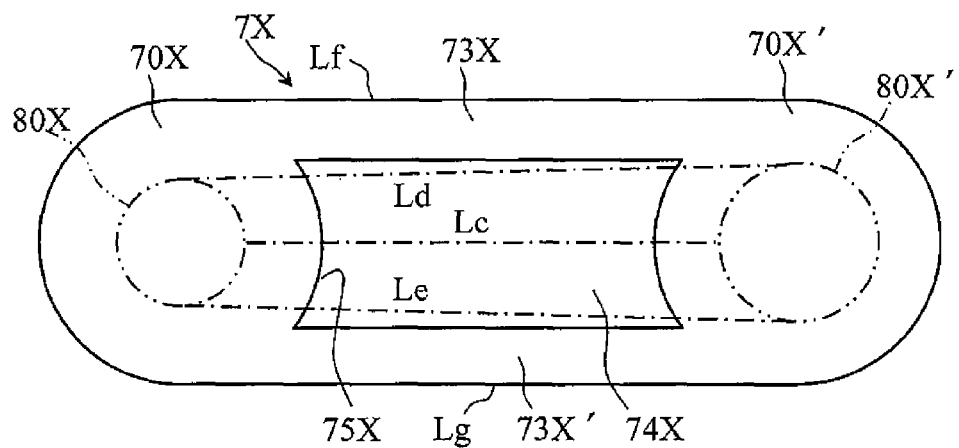
FIG. 9 is a plan view of the conductive layer shown in FIG. 7.

As shown in FIGS. 7 to 9, a line portion 71X includes a pair of lead portions 73X and 73X' that connects two land portions 70X and 70X' to each other. The lead portions 73X and 73X' are apart from each other in a plan view without being contacted with each other. An opening portion 74X is located between the lead portions 73X and 73X', which divides a current flowing through the line portion 71X in the longitudinal direction thereof. Since the current flows through the lead portions 73X and 73X', the current enters into the land portions 70X and 70X' at more than one portions. As a result, the current is widely distributed around a connecting area 80X (80X') between the land portion 70X (70X') and a via conductor 8X (8X'), which can suppress the generation of electromigration.

Figure 16:
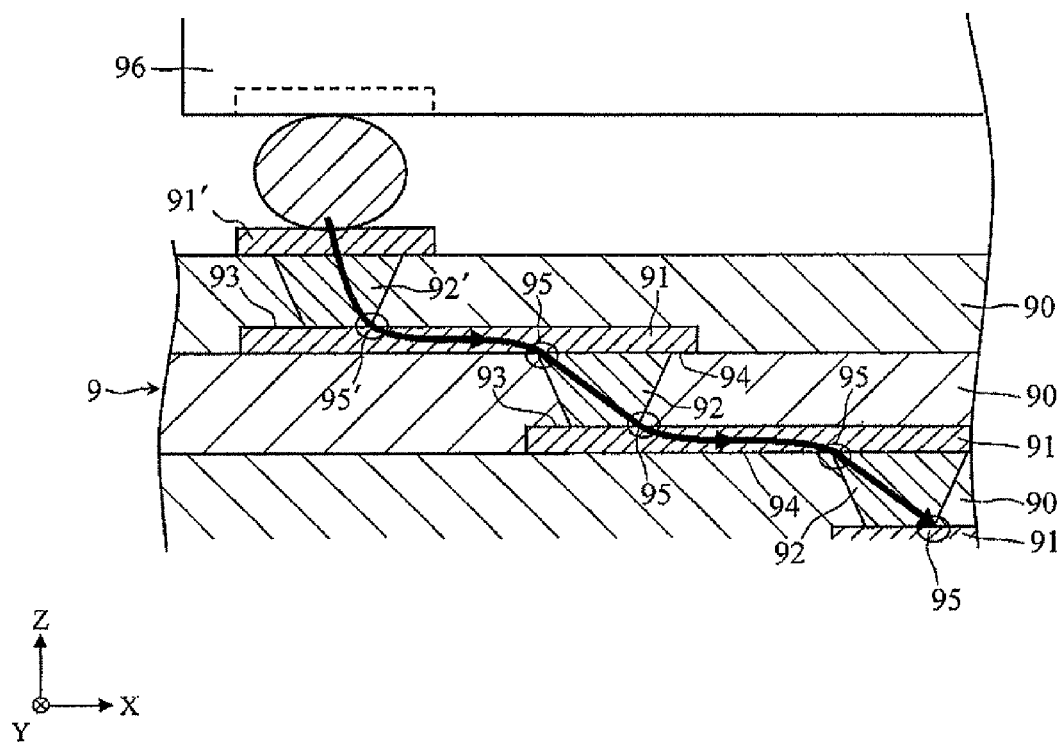
FIG. 16 is a sectional view showing a principal part in an example of a conventional structure.

The lead portions 73X and 73X' are arranged so as not to overlap with a hypothetical line Lc that connects the land portions 70X and 70X' (the connecting areas 80X and 80X' in contact with the via conductors 8X and 8X') to each other through the shortest route. In this structure, the lead portions 73X and 73X' are connected to the land portions 70X and 70X' without passing through a region corresponding to the portions 95 and 95' in FIG. 16. Therefore, the current in the connecting areas 80X and 80X' can be further dispersed.

The lead portions 73X and 73X' are arranged in parallel so as to be symmetrical with respect to the hypothetical line Lc. In this structure, a current theoretically flows into the connecting areas 80X and 80X' symmetrically with respect to the hypothetical line Lc. Therefore, the amount of the current flowing through the lead portion 73X can be closer to that of the current flowing through the lead portion 73X'.

The lead portions 73X and 73X' are arranged outside the region between two tangent lines Ld and Le, each line contacts both circumferences of the connecting areas 80X and 80X'. In this structure, the distance between the lead portions $73x$ and $73x'$ is larger than a diameter of the connecting areas $80x$ ($80x'$) in a width direction of the lead portions. Therefore, the divided current is less likely to be merged in the land portion 70X (70X'), and the current from the land portion 70X (70X') is easy to be divided.

The lead portions 73X and 73X' are arranged inside the region between two hypothetical tangent lines Lf and Lg, each line contacts the land portions 70X and 70X'. Thus, the width of the line portion 71X remains small, and highly dense circuit pattern can be provided, and a circuit board 3X can be downsized.

As shown in FIG. 9, the land portions 70X and 70X' and the contacting area 80X and 80X' are formed into a circular shape in a plan view. Therefore, the alignment precision between the land portions 70X (70X') and the via conductors 8X (8X') is improved. In addition, the counter side 75X between the land portion 70X and the opening portion 74X constitute a part of the circular shape. Consequently, the distance in the longitudinal direction of the lead portion between the connecting area 80X and the connecting point connecting the lead portions 73X (73X') to the land portion 70X can be shortened. The present invention is not limited to the above-described embodiment, and various changes and modifications can be made without departing from the spirit and scope of the present invention. For example, the number of the lead portions is not necessarily two, and may be three or more. The planar shape of the land portions is not necessarily a circle, and the conductive layer may have one of the structures shown in FIGS. 10A to 10E.

In the conductive layers 7XA, 7XB, 7XC, and 7XD respectively shown in FIGS. 10A to 10D, the shapes of land portions 70XA, 70XB, 70XC, 70XD, 70XA', 70XB', 70XC', and 70XD' are different from those of the conductive layer 7X (refer to FIGS. 7 to 9) in the circuit board 3X described above.

Figure 10A:
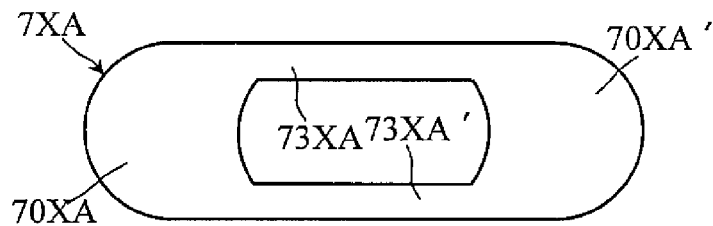
FIGS. 10A to 10E are plan views showing other examples of the conductive layer according to the second embodiment of the present invention.

In the conductive layer 7XA shown in FIG. 10A, the land portions 70XA and 70XA' are not circular and the counter side 75X of the land portions 70XA and 70XA' facing each other have arc shapes. The distance between the middle portions of the counter side 75X of the land portions 70XA and 70XA' is larger than the distance between the end portions of the counter sides 75X of the land portions 70XA and 70XA'. If the boundary reach the connecting area, the current around the connecting area 80X can be further dispersed.

Figure 10B:
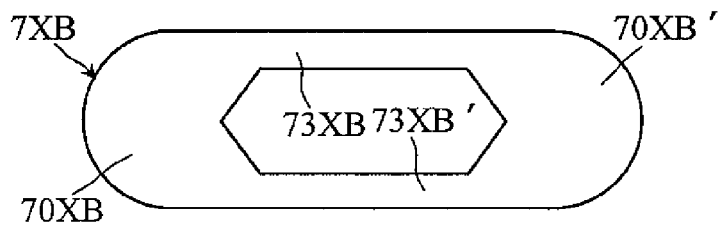
Figure 10C:
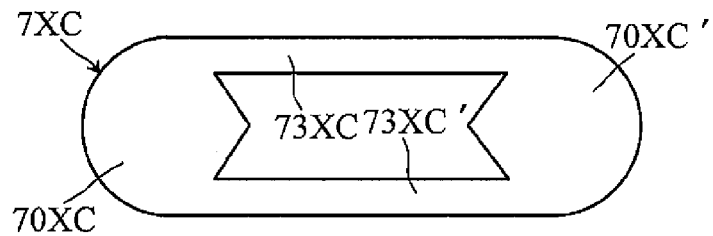

In the conductive layers 7XB and 7XC shown in FIGS. 10B and 10C, the land portions 70XB, 70XB', 70XC, and 70XC' are not circular. The edges of the land portions 70XB and 70XB' facing each other and the edges of the land portions 70XC and 70XC' facing each other are V-shaped.

Figure 10D:
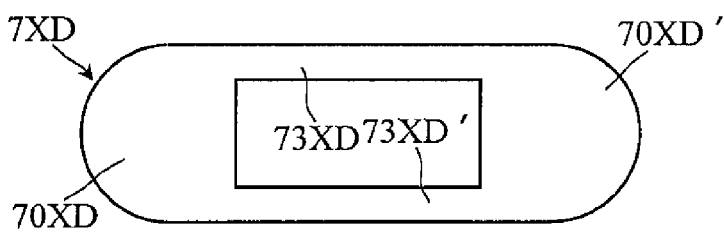

In the conductive layer 7XD shown in FIG. 10D, the land portions 70XD and 70XD' are not circular and the edges of the land portions 70XD and 70XD' facing each other are straight.

Figure 10E:
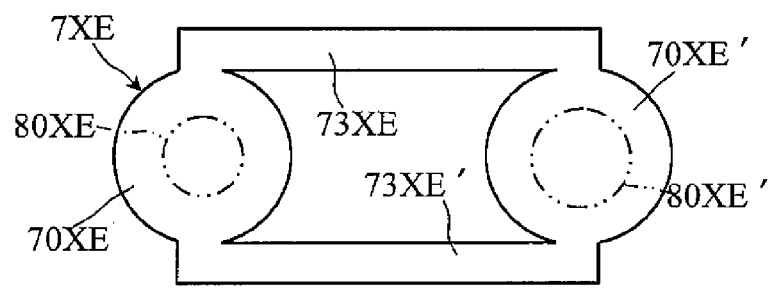

In the conductive layer 7XE shown in FIG. 10E, the connecting points connecting the lead portions 73XE and 73XE' to the land portions 70XE and 70XE' are different from those in the conductive layer 7X (refer to FIGS. 7 to 9) of the above-described circuit board 3X. In the conductive layer 7XE, the distance between the connecting points in the width direction of the line portion can be increased. Therefore, the current in the connecting areas 80X and 80X' can be more widely distributed.

The connection structure that uses the land portions 70XE and 70XE', shown in FIG. 10E can be applied to the conductive layers 7XA to 7XD shown in FIGS. 10A to 10a.

EXAMPLES

Example 1

In this Example, the effect of the shape of a conductive layer corresponding to the first embodiment on the current density in the connecting region between a via conductor and a land portion was investigated.

Figure 11A:
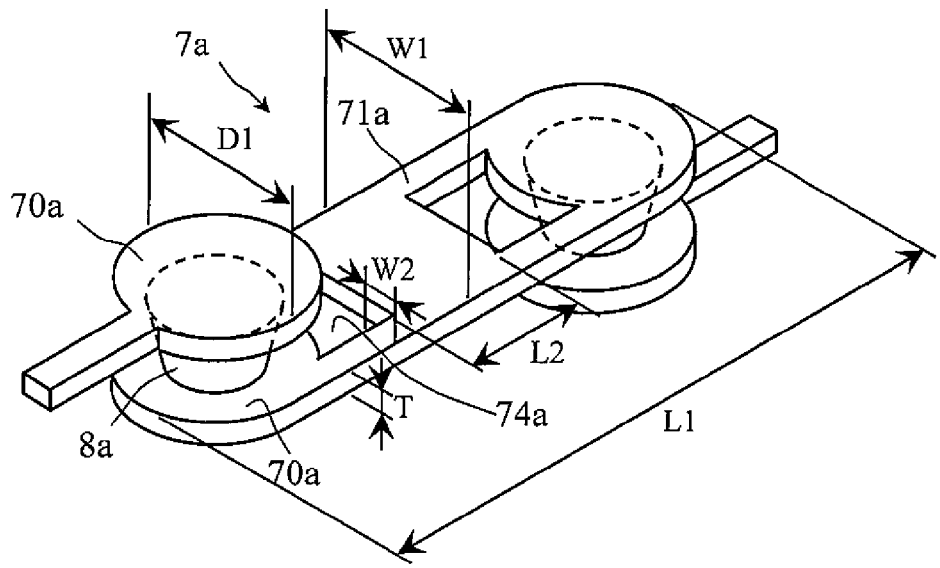
FIGS. 11A and 11B are perspective views for describing conductive layers whose current densities are to be calculated in Example 1.
Figure 11B:
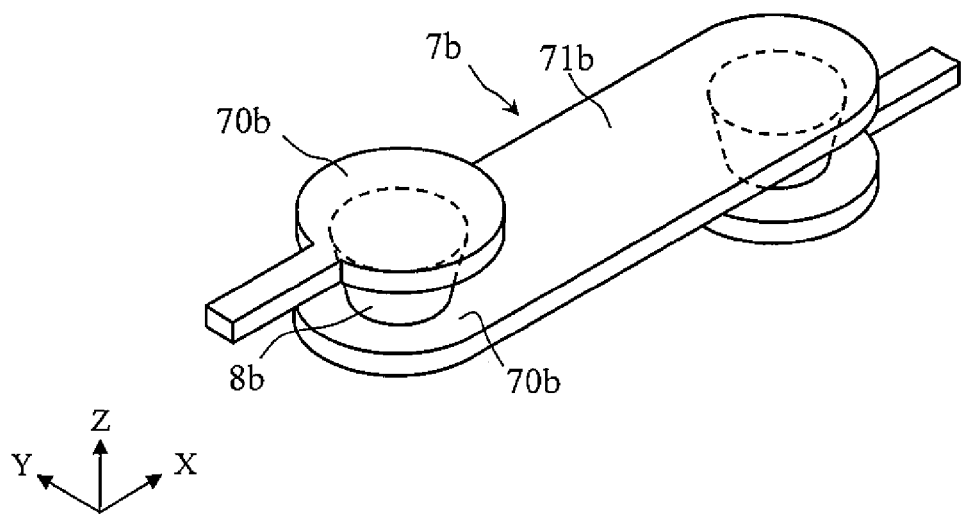

The current densities of conductive layers 7a and 7b shown in FIGS. 11A and 11B were calculated by performing simulations.

In the conductive layer 7a shown in FIG. 11A, a line portion 71a includes an opening portion 74a that penetrates the conductive layer 7a in the thickness direction and divides a current flowing through the line portion 71a. The size of the conductive layer 7a is shown in Tables 1 and 2. The size of a connecting area 80a between a via conductor 8a and a land portion 70a is shown in Table 3. D2 and D3 shown in Table 3 appear in FIG. 12.

TABLE 1

| D1 | W1 | T | L1 |
|---|---|---|---|
| 120 μm | 120 μm | 13 μm | 360 μm |

TABLE 2

| W2 | L2 |
|---|---|
| 25 μm | 60 μm |

TABLE 3

| D2 | D3 |
|---|---|
| 60 μm | 48 μm |

In the conductive layer 7b shown in FIG. 11B, a line portion 71b does not include an opening portion and, the size of the conductive layer 7b is the same as that of the conductive layer 7a shown in FIG. 11A. The conductive layer 7b corresponds to a conventional conductive layer.

Figure 12:
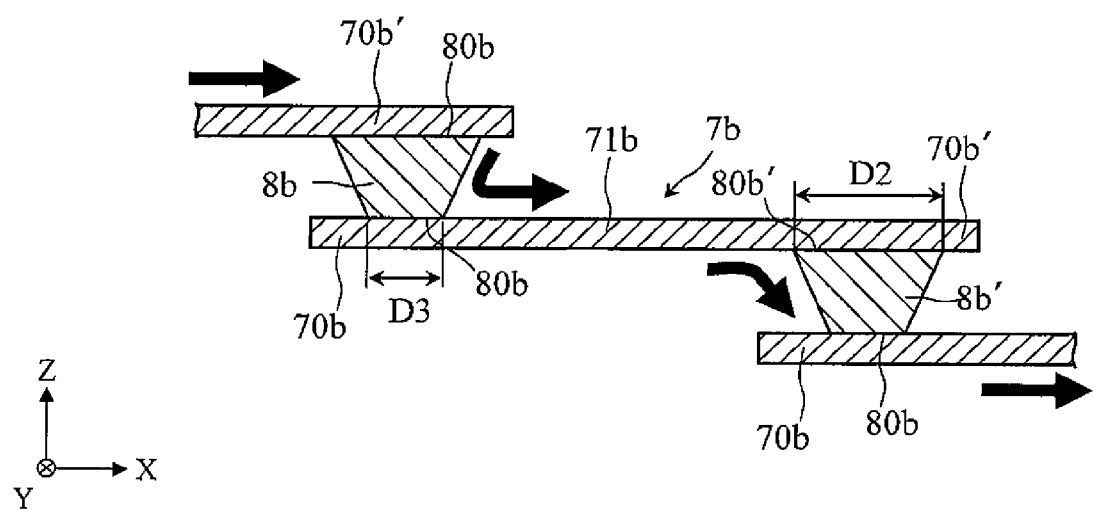
FIG. 12 is a sectional view of an example shown in FIG. 11B for describing the path of a current flowing in a simulation.
Figure 13A:
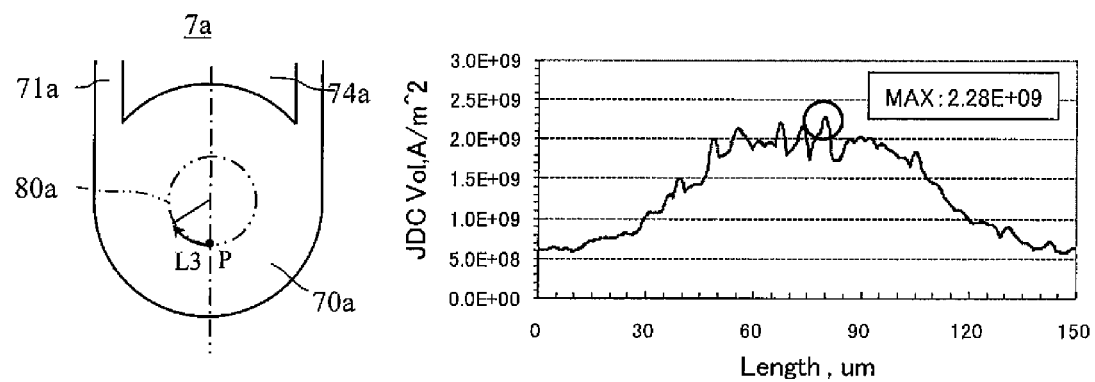
FIGS. 13A and 13B are plan views showing principal parts of the conductive layers in FIGS. 11A and 11B and graphs showing the simulation results of the current densities.
Figure 13B:
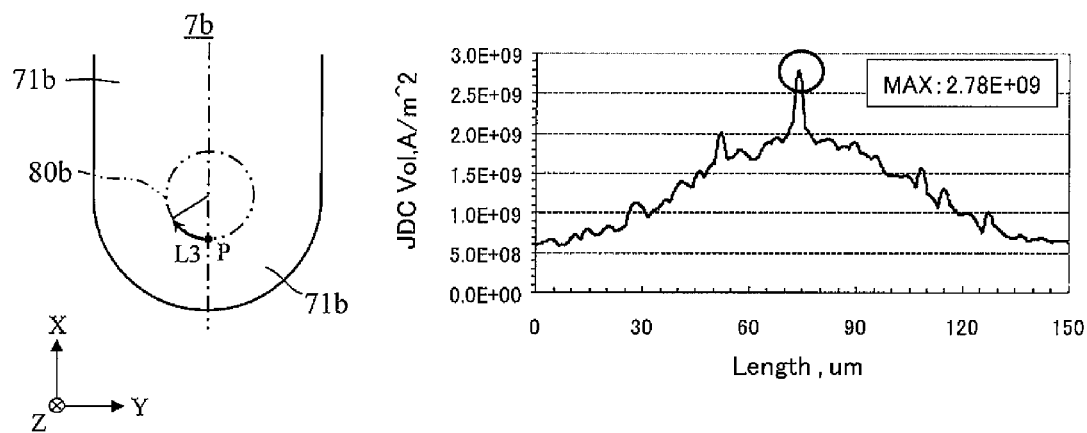

Assuming that 1A of direct current flows from a land portion 70b to the line portion 71b as shown in FIG. 12, the current density along the rim of a connecting area 80b between the bottom of the via conductor 8b and the land portion 70b of the conductive layer 7b was calculated. The current density along the rim of a connecting area 80a was also calculated in the same manner as that of the connecting area 80b. The current densities were calculated using commercially available software "Ansoft Q3D Extractor". FIGS. 13A and 13B show the results. In each of the drawings, the abscissa indicates the length L3 along the rim of the connecting area 80a or 80b from a reference point P and the ordinate indicates the result of the calculated current density.

As shown in FIGS. 13A and 13B, in the conductive layer 7a shown in FIG. 11A, a portion having high current density extends over a relatively wide area. In contrast, in the conductive layer 7b shown in FIG. 11B, a current becomes concentrated in a portion opposite the reference point P.

The maximum current density calculated for the conductive layer 7a shown in FIG. 11A was smaller than that calculated for the conductive layer 7b shown in FIG. 11B.

The structure in which the line portion includes the opening portion that divides a current can suppress the concentration of the current in one part of the connecting region between the land portion and the via conductor.

Example 2

In this Example, the effect of the shape of a conductive layer corresponding to the second embodiment on the current density in the connecting region between a via conductor and a land portion was investigated.

Figure 14A:
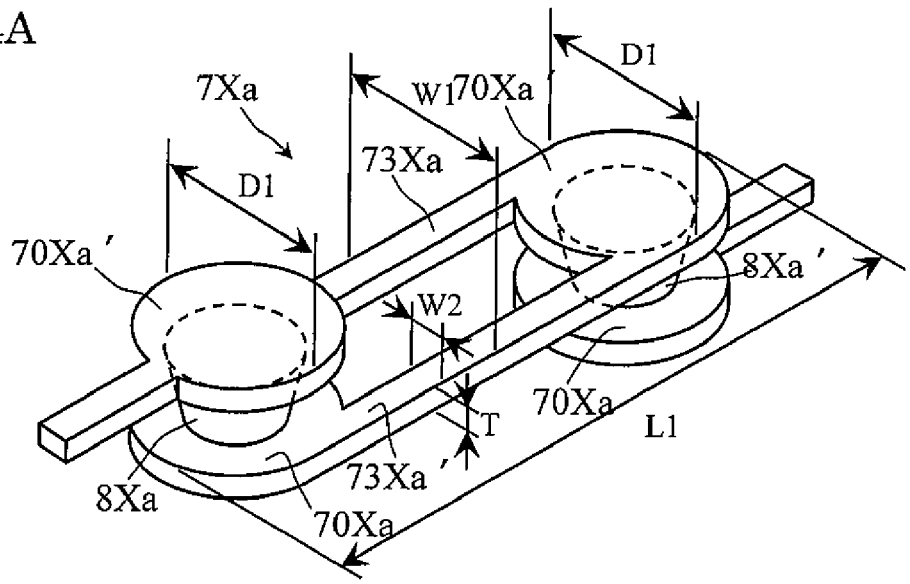
FIGS. 14A to 14C are perspective views for describing conductive layers whose current densities are to be calculated in Example 2.
Figure 14B:
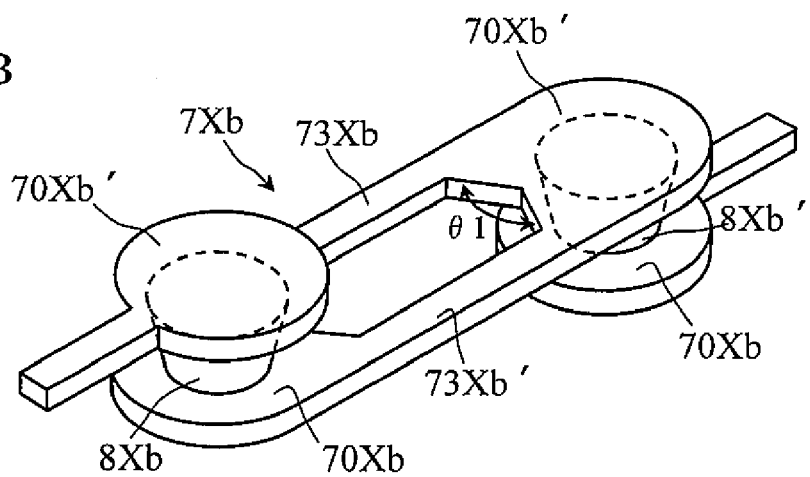
Figure 14C:
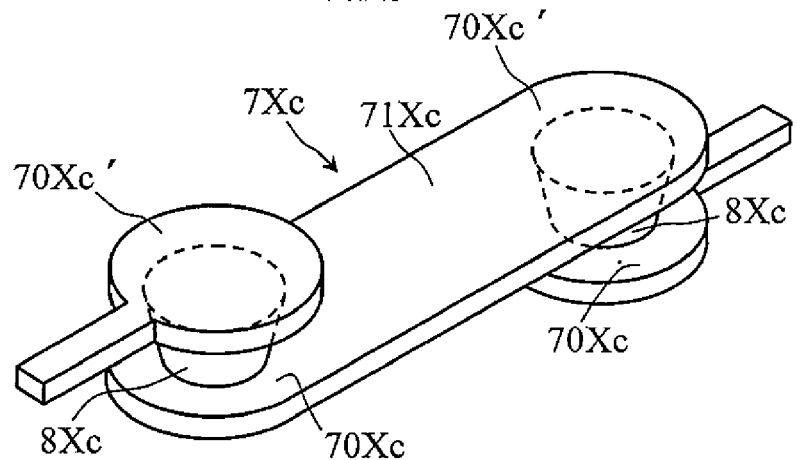

The current densities of conductive layers 7Xa, 7Xb, and 7Xc shown in FIGS. 14A to 14C were calculated by performing simulations.

In the conductive layer 7Xa shown in FIG. 14A, land portions 70Xa and 70Xa' are formed so as to be circular and the land portions 70Xa and 70Xa' are connected to each other through a pair of lead portions 73Xa and 73Xa'. The size of the conductive layer 7Xa is shown in Table 4.

TABLE 4

| D1 | W1 | W2 | T | L1 |
|---|---|---|---|---|
| 120 μm | 120 μm | 13 μm | 8 μm | 420 μm |

In the conductive layer 7Xb shown in FIG. 14B, the edges of the land portions 70Xb and 70Xb' are V-shaped. The size of the conductive layer 7Xb is substantially the same as that of the conductive layer 7Xa shown in FIG. 14A, but the angle θ1 in each of the V-shaped edges of the land portions 70Xb is 120 degrees.

In the conductive layer 7Xc shown in FIG. 14C, a line portion 71Xc includes neither a lead portion nor an opening portion and, the size of the conductive layer 7Xc is the same as that of the conductive layer 7Xa shown in FIG. 14A. The conductive layer 7Xc corresponds to a publicly known conductive layer.

Figure 15A:
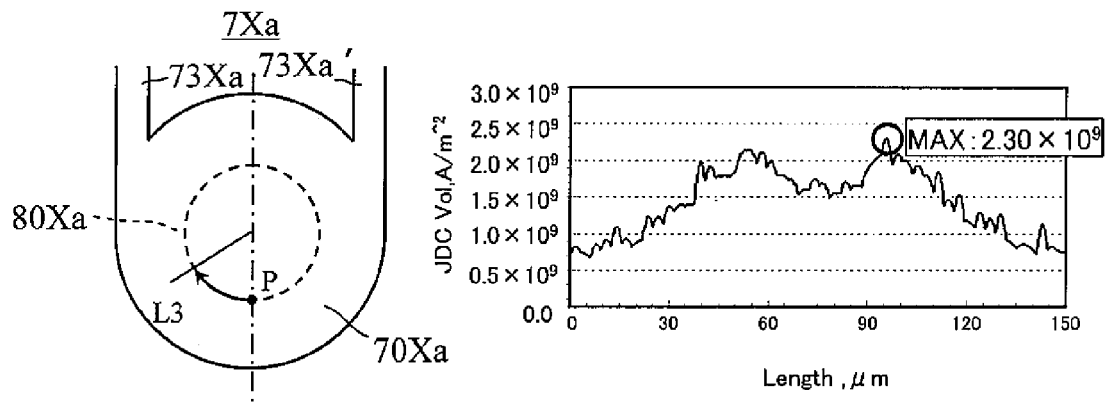
FIGS. 15A to 15C are plan views showing principal parts of the conductive layers in FIGS. 14A to 14C and graphs showing the simulation results of the current densities.
Figure 15B:
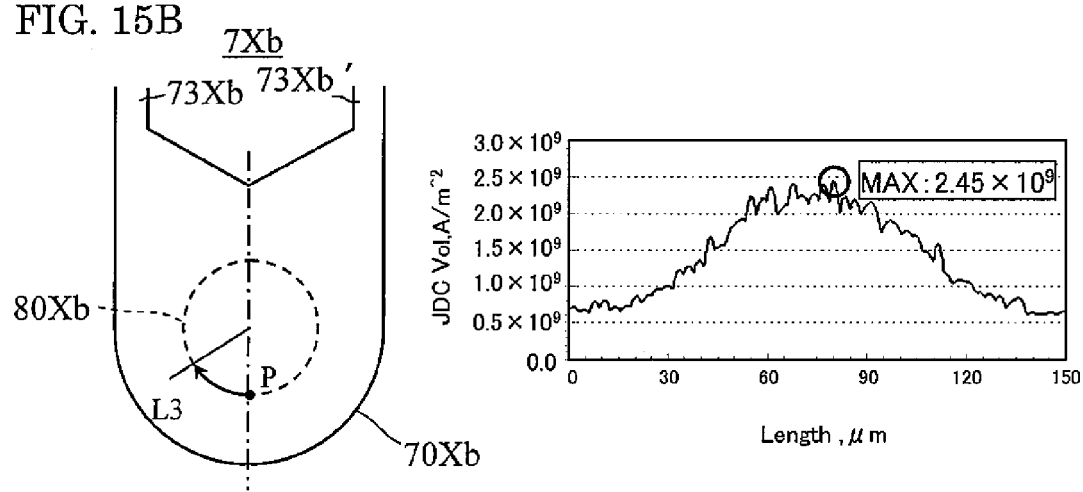
Figure 15C:
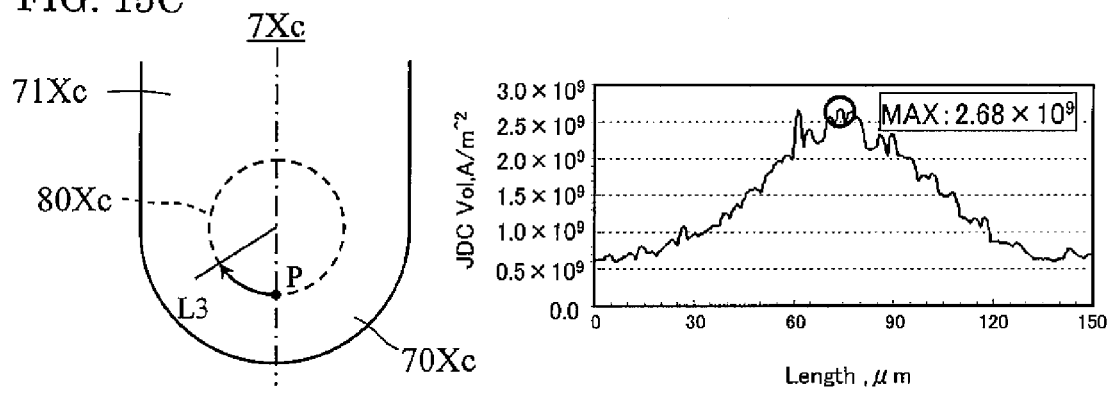

The current densities were calculated in the same manner as in Example 1, and FIGS. 15A to 15C show the results.

As shown in FIGS. 15A to 15C, in the conductive layers 7Xa and 7Xb shown in FIGS. 14A and 14B, a portion having high current density extends over a relatively wide area. In contrast, in the conductive layer 7Xc shown in FIG. 14C, a current becomes concentrated in a portion opposite the reference point P.

The maximum current densities calculated for the conductive layers 7Xa and 7Xb shown in FIGS. 14A and 14B were smaller than that calculated for the conductive layer 7Xc shown in FIG. 14C.

The structure in which land portions are connected to each other through a pair of lead portions apart from each other can suppress the concentration of the current in one part of the connecting region between the land portion and the via conductor.

As shown in FIG. 15A, in the conductive layer 7Xa (a structure in which the planar shape of the land portion is circular) shown in FIG. 14A, portions having high current densities are separated. Thus, the maximum current density calculated for the conductive layer 7Xa shown in FIG. 14A was even smaller than that calculated for the conductive layer 7Xb shown in FIG. 14B.

In FIG. 15A, the distance from the connecting area 80Xa to the connecting points between the lead portions 73Xa and 73Xa' and the land portion 70Xa is short and thus the space between the connecting points and the connecting area 80Xa is small. Therefore, currents flowing from the lead portions 73Xa and 73Xa' to the connecting area 80Xa are not easily joined in that space. Consequently, the current in the connecting area 80Xa can be divided in an excellent manner.

In contrast, in the structure shown in FIG. 14B, the land portions 70Xb and 70Xb' are not circular and the edges of the land portions 70Xb and 70Xb' facing each other have V-shapes. A corner of the V-shapes protrudes toward the connecting area 80Xb. Thus, the maximum current density calculated for the conductive layer 7Xb is larger than that calculated for the conductive layer 7Xa shown in FIG. 14A.

This is because, if the minimum width of the land portion 70Xb is equal to that of the land portion 70Xa shown in FIG. 14A in consideration of comparison using the same size, the distance between the connecting area 80Xb and the connecting points connecting the lead portions 73Xb and 73Xb' to the land portion 70Xb becomes large, which facilitates the joining of a current in a region between the connecting points and the connecting area 80Xb.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit board comprising:
    a conductive, layer including
        a first land portion,
        a second land portion apart from the first land portion in a plan view,
    a line portion connecting the first land portion and the second land portion to each other, and including lead portions through which a current is to flow and an opening portion arranged between the lead portions, the opening portion penetrating the conductive layer in a thickness direction,
    wherein the line portion further includes a connecting portion which connects the lead portions to each other and wherein a width of the connecting portion is narrower than a width of the opening portion.

2. A circuit board comprising:
    a conductive, layer including
    a first land portion,
    a second land portion apart from the first land portion in a plan view, and
    a line portion connecting the first land portion and the second land portion to each other, and including lead portions through which a current is to flow and an opening portion arranged between the lead portions, the opening portion penetrating the conductive layer in a thickness direction;
    a first conductor connected to the first land portion; and
    a second conductor connected to the second land portion,
    wherein a first connecting area represents an area between the first conductor and the first land portion, a second connecting area represents an area between the second conductor and the second land portion, and a pair of hypothetical tangent lines represents lines which contact both the first connecting area and the second connecting area, respectively, and
    the lead portions are arranged outside a region between the pair of the hypothetical tangent lines.

3. The circuit board according to claim 2, wherein a pair of hypothetical tangent lines represents lines which contacts both the first land portion and the second land portion, respectively, and
   the lead portions are arranged in a region between the pair of the hypothetical tangent lines.

4. The circuit board according to claim 2, further comprising:
   a conductor connected to the first land portion and serving as an external connection terminal.

5. A structure comprising:
   the circuit board according to claim 2; and
   an electronic component mounted on or embedded in the circuit board and electrically connected to the conductive layer.

6. The circuit board according to claim 2, wherein the opening portion is formed in the entire area between the first land portion and the second land portion.

7. The circuit board according to claim 6, wherein the lead portion connects the first land portion and the second land portion to each other.

8. The circuit board according to claim 2, wherein the opening portion is configured to divide the current flowing through the line portion.

9. The circuit board according to claim 8, wherein the line portion further includes a connecting portion which connects the lead portions to each other.

10. The circuit board according to claim 9, wherein a circumference of the opening portion is along a circumference of the first land portion.

11. The circuit board according to claim 10, wherein the opening portion has a corner side facing the land portion, and an angle between the corner side of the first land portion and the lead portion is less than 90 degree.

12. The circuit board according to claim 9, further comprising:
    a conductor connected to the first land portion,
    wherein the connecting area between the first land portion and the conductor is within a locus area which is hypothetically made by moving the opening portion toward the first land portion in a longitudinal direction of the line portion.

13. The circuit board according to claim 9, wherein the opening portion comprises a first opening portion closer to the first land portion than to the second land portion, and a second opening portion closer to the second land portion than to the first land portion.

14. The circuit board according to claim 9, wherein a width of the opening portion becomes narrower toward the second land portion which is arranged more apart from the opening portion than the first land portion is.

* * * * *